United States Patent [19]

Miyamoto

[11] Patent Number: 5,111,435
[45] Date of Patent: May 5, 1992

[54] BIPOLAR-CMOS SEMICONDUCTOR MEMORY DEVICE

[75] Inventor: Junichi Miyamoto, Yokohama, Japan

[73] Assignee: Kabushiki Kaisha Toshiba, Kawasaki, Japan

[21] Appl. No.: 652,491

[22] Filed: Feb. 8, 1991

Related U.S. Application Data

[63] Continuation of Ser. No. 167,174, Mar. 11, 1988, abandoned.

[30] Foreign Application Priority Data

Mar. 31, 1987 [JP] Japan .................. 62-79178

[51] Int. Cl.[5] .............................. G11C 8/00
[52] U.S. Cl. ...................... 365/230.06; 365/190; 365/177; 365/208
[58] Field of Search ............... 365/154, 177, 189.06, 365/190, 205, 207, 208, 230.06

[56] References Cited

U.S. PATENT DOCUMENTS

| | | | |
|---|---|---|---|
| 4,604,533 | 8/1986 | Miyamoto et al. | 307/530 |
| 4,616,342 | 10/1986 | Miyamoto | 365/190 |
| 4,658,159 | 4/1987 | Miyamoto | 365/208 |
| 4,665,505 | 5/1987 | Miyakawa et al. | 365/177 |
| 4,713,796 | 12/1987 | Ogive et al. | 365/189 |
| 4,727,517 | 2/1988 | Ueno et al. | 365/177 |
| 4,825,413 | 4/1989 | Tran | 365/177 |
| 4,829,479 | 5/1989 | Mitsumoto et al. | 365/177 |
| 4,853,899 | 8/1989 | Kitsukawa et al. | 365/177 |

Primary Examiner—Glenn Gossage
Attorney, Agent, or Firm—Foley & Lardner

[57] ABSTRACT

A semiconductor memory device of the composite type comprising bipolar and MOS transistors includes a memory cell array comprising MOS type memory cells arranged in a matrix manner, plural pairs of bit lines for connecting the MOS type memory cells in a column direction, and a plurality of bipolar transistors provided on the bit lines, respectively wherein the bases thereof are connected to the bit lines and the emitters thereof are commonly connected. This device further includes a constant current source connected to the common junction of the emitters of the plurality of bipolar transistors, and a column select unit for selecting of the MOS type memory cells in the column direction by allowing potentials on the bit lines of a pair to be selected of the plural pairs of bit lines to be different from those on the bit lines of non-selected pairs. In addition, this device includes row select means for selecting the MOS type memory cells in a row direction by allowing potentials on the bases of second bipolar transistors connected to word lines to be selected of a plurality of word lines to be different from those on the basis of the second bipolar transistors connected to non-selected word lines. Thus, a semiconductor memory device with low power dissipation and operable at a high speed is realized.

9 Claims, 3 Drawing Sheets

BIPOLAR-CMOS SEMICONDUCTOR MEMORY DEVICE

This application is a continuation, of application Ser. No. 07/167,174, filed Mar. 11, 1988, now abandoned.

BACKGROUND OF THE INVENTION

This invention relates to a semiconductor device, and more particularly to a semiconductor memory device having a Bi-CMOS structure of the composite type which comprises bipolar and CMOS transistors.

Devices of Bi-CMOS structures made up by the combination of bipolar and CMOS transistors combine the high speed property of the bipolar transistor and the high density property of the CMOS transistor, thus making it possible to realize a high density and high speed semiconductor memory device.

A conventional semiconductor memory device of the Bi-CMOS structure is shown in FIG. 1. Each memory cell 1 comprises CMOS transistors in accordance with the high density requirement. For example, a memory cell of the six-transistor type comprised of six MOS transistors or a memory cell comprising a high resistance polysilicon as the load of the MOS transistors is employed. To a pair of bit lines 3 and 4 connected to the memory cell 1, NMOS transistors 2 as a load are connected, respectively. To the memory cell 1, a word line 5a is connected. Transfer gates 5 which are paired with each other and controlled by a column select line 6 are provided on the paired bit lines 3 and 4, respectively. Further, sense lines 7 and 8 are connected to the bit lines 3 and 4, respectively. These sense lines 7 and 8 are connected to a sense amplifier 9. The sense amplifier 9 comprises a pair of bipolar transistors 9a for which the emitters are commonly connected, a pair of resistance loads 9b connected in series therewith, and a constant current source 9c connected to the common junction of the emitters of the pair of bipolar transistors 9a.

When the word line 5a is raised to a high potential for selection, the bit line 21 connected to the side where the driver transistor of the memory cell 1 is on, draws a current thereinto, so that the potential thereof takes a value lower than that of the bit line connected to the side where the driver transistor of the memory cell 1 is off. The difference between the potentials on the bit lines 3 and 4 passes through the transfer gates 5 opened by the column select line 6 and is output to the sense lines 7 and 8. The difference between the potentials on the sense lines 7 and 8 is amplified by the sense amplifier 9. The amplified output is outputted from the collector of the bipolar transistor 9a.

Since the conventional semiconductor memory device constituted as above uses a high sensitivity sense amplifier comprising bipolar transistors, it is possible to suppress the potential difference ΔV across bit lines so that it is equal to a small value. On the other hand, the delay time Δt is expressed by the following equation:

$$\text{Delay time}\Delta t = C \cdot \Delta V / i \qquad (1),$$

where C is a capacitance value of a bit line and i is a current value flowing to a selected cell. Since the voltage difference ΔV across the bit lines is small, high speed access can be realized.

With the conventional semiconductor memory device, however, the following problems occur because of descaling of the memory cells resulting from the requirement of high memory capacity and/or an increase in parasitic capacitance connected to bit lines and sense lines. The parasitic capacitance of the bit lines 3 and 4 is due to the drain of an MOS transistor of a non-selected memory cell 1 and/or the wiring, and the parasitic capacitance of the sense lines 7 and 8 is due to the drain of the transfer gate 5 of non-selected bit line 3 or 4. Especially, when the parasitic capacitance by the drain of the transfer gate 5 is large, it is required to draw a large quantity of current from the bit lines 3 and 4 at the time of writing into the memory cell 1, resulting in the problem that the size of the transistor cannot be reduced.

Further, by the back-gate effect of the transfer gate 5, the conductance becomes high with respect to the potential on the side of high potential of the bit lines 3 and 4, so that a voltage is difficult to reach the sense amplifier 9. Since it is necessary to supply a base current to the sense amplifier 9, it is necessarily required for high speed operation to maintain the high potential side at a low impedance. Accordingly, the conventional semiconductor device has the problem that it is difficult to perform high speed operation.

A further problem lies in that the drawing current of the memory cell 1 bearing the current value i in the above-mentioned equation (1) cannot be set to a large value, when the narrow channel effect is taken into account, because the size of the transistor on the drive side of the memory cell must be reduced because of high density requirement.

Thus, with the conventional semiconductor memory device, for the potentials on the sense lines 7 and 8, as shown in FIG. 2, the potential on the side of the high potential thereof cannot exceed above a reference potential 10, so that the potential difference across the sense lines 7 and 8 can only take a value of about 0.5 volts. In addition, with the conventional semiconductor memory device, a large parasitic capacitor is charged and discharged by a small current, and the conductance of the bit line on the side of high potential is high when viewed from the side of the sense amplifier, so that the performance of the sense amplifier comprised of bipolar transistors in not sufficiently exhibited.

SUMMARY OF THE INVENTION

An object of this invention is to provide a semiconductor memory device having a Bi-MOS structure having low power dissipation and which is capable of performing high speed operation.

The above object is accomplished by a semiconductor memory device comprising: a memory cell array comprising MOS type memory cells arranged in a matrix manner; plural pairs of bit lines for connecting the MOS type memory cells in a column direction; a plurality of bipolar transistors provided on the bit lines, respectively, the bases thereof being connected to the bit lines, the emitters thereof being commonly connected; a constant current source connected to the common junction of the emitters of the plurality of bipolar transistors; and column select unit for carrying out selection of the MOS type memory cells in the column direction by allowing potentials on the bit lines of a pair to be selected of the plural pairs of bit lines so as to be different from those on bit lines of non-selected pairs thereof.

Since the Bi-CMOS semiconductor device according to this invention is constituted as above, the bit lines and the sense lines are separated by the bipolar transistor. Thus, the memory cell is only required to carry out charging/discharging of the bit lines, with the result that the required current is reduced. Further, there is no transfer gate for column selection in this device, resulting in a small decrease in the ability of supplying a base current to the sense amplifier. Accordingly, the semiconductor memory device according to this invention can perform high speed operation with low power dissipation and can increase the degree of integration.

DETAILED DESCRIPTION OF THE INVENTION

Figure 1:
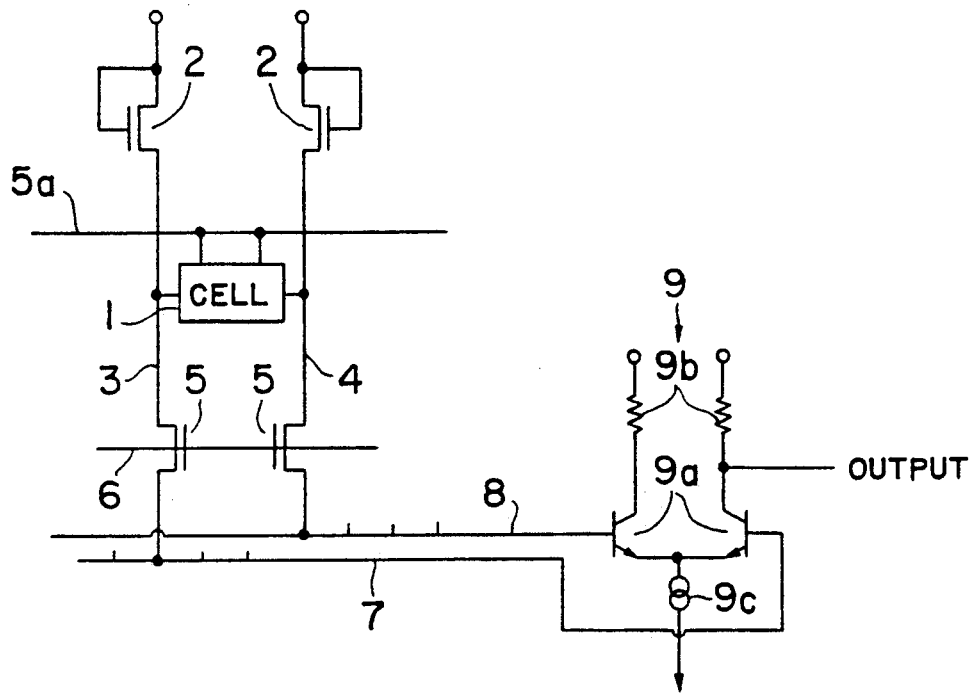
FIG. 1 is a circuit diagram showing the essential parts of a conventional semiconductor memory device.
Figure 2:
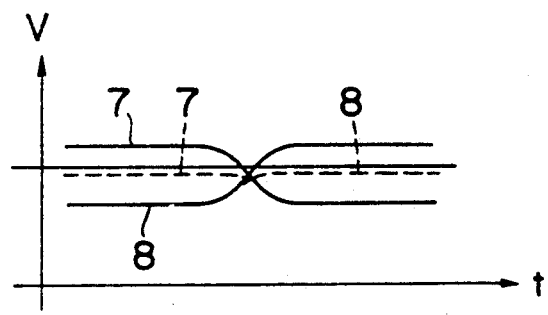
FIG. 2 is a time chart showing the operation of the conventional semiconductor memory device shown in FIG. 1.
Figure 3:
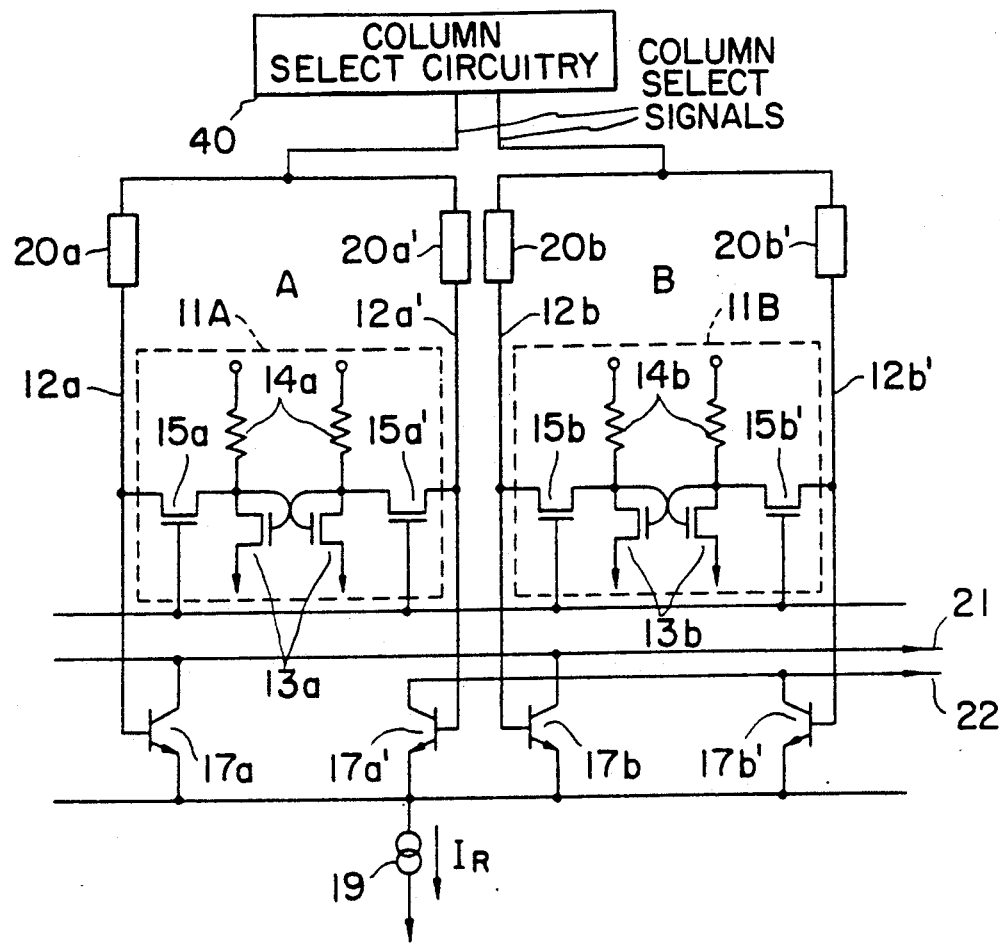
FIG. 3 is a circuit diagram showing an embodiment of a semiconductor device according to this invention.

The essential parts of a semiconductor device according to an embodiment of this invention are shown in FIG. 3. A memory cell 11A is provided on the column A, and a memory cell 11B is provided on the column B. In the memory cell 11A, a pair of MOS transistors 13a for holding information and a pair of resistors 14a connected to these MOS transistors 13a are provided. The memory cell 11A is connected to bit lines 12a and 12a' through respective transfer gates 15a and 15a'. To the bit lines 12a and 12a', loads 20a and 20a' are connected, respectively. These loads 20a and 20a' are commonly connected and are further connected to column select means 40. For the loads 20a, 20a', 20b and 20b', PMOS transistors, NMOS transistors, resistors and the like may be used.

Also in the memory cell 11B, a pair of MOS transistors 13b for holding information and a pair of resistors 14b connected to these MOS transistors 13b are provided. The memory cell 11B is connected to the bit lines 12b and 12b' through respective transfer gates 15b' and 15'. To the bit lines 12b and 12b', loads 20b and 20b' are connected, respectively. These loads 20b and 20b' are commonly connected and are further connected to column select means 40.

The column selection by the column select means is carried out by raising the potential on the bit lines of a column to be selected.

The opposite sides of the bit lines 12a, 12a', 12b and 12b' to the loads 20a, 20a', 20b and 20b' are connected to the bases of bipolar transistors 17a, 17a' 17b and 17b', respectively. The emitters of the bipolar transistors 17a, 17a', 17b and 17b' are commonly connected and are further connected to a constant current source 19. The collectors of the bipolar transistors 17a and 17b provided in association with the bit lines 12a and 12b on the left side are commonly connected and are further connected to a sense line 21. Likewise, the collectors of the bipolar transistors 17a' and 17b' provided in association with the bit lines 12a' and 12b' on the right side are commonly connected and are further connected to a sense line 22. These sense lines 21 and 22 are connected to a sense amplifier (not shown). Thus, a voltage across these sense lines 21 and 22 is sensed.

Figure 4:
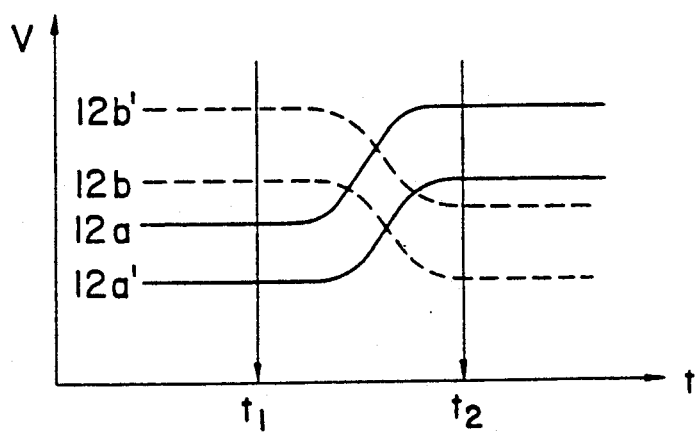
FIG. 4 is a time chart showing the operation of the semiconductor device shown in FIG. 3.

The operation of this embodiment will now be explained. It is assumed that the transistor on the side of the bit line 12a' is in the on state on the column A and the transistor on the side of the bit line 12b is in the on the state on the column B. FIG. 4 shows changes in potentials on the bit lines 12a, 12a', 12b and 12b' when the select column shifts from the column B to the column A. Since the readout current IR flows in the bipolar transistor 17 of which base potential is the highest, it flows through the bit line 12b', i.e., the bipolar transistor 17b' at time $t_1$, and it flows through the bit line 12a, i.e., the bipolar transistor 17a, at time $t_2$. Since the bipolar transistors, 17a, 17a' 17b and 17b' are biased so that they are in a non-saturated state, a current expressed as IR(B−1)/B (B is a current amplification factor of the bipolar transistor), which is nearly equal to the current IR flows through the sense line 21 at time $t_1$. Thus, it is sufficient to read a current indicative of the difference between its current and a current flowing through the sense line 22. Further, since a current nearly equal to the current IR flows through the sense line 22 at the time $t_2$, it is sufficient to read a current indicative of the difference between its current and a current flowing through the sense line 21. It is to be noted that the high level of non-selected bit lines is lower than the low level of selected bit lines in FIG. 4, but such a level setting is not necessarily required. The sense amplifier is only required to sense a current difference between sense lines 21 and 22.

As just described above, this embodiment provides the advantages described below:

① Since there is no transfer gate for column selection, the decrease in the ability of supplying a base current to the sense amplifier is small.

② Since the bit lines and the sense lines are separated by the bipolar transistor, it is sufficient that a current of the memory cell only shares the charging/discharging of the bit line.

③ The charging/discharging of the sense line having a large parasitic capacitance may be conducted using current IR by the constant current source, which is larger several times than a current of the memory cell. For this reason, delay due to the insufficient current in the prior art can be reduced. It is to be noted that since this current IR flows through one of sense lines, the operating current is not increased to any great extent.

④ Since the potential difference supplied from the sense line to the sense amplifier is the same order as the potential difference on the bit line, sensing is facilitated.

⑤ The value of a current flowing through the bit line into the drive transistor on the "on" side of the memory cell becomes large by the influence of the potential on the bit line as it is increased. In accordance with this embodiment, potentials on bit lines of non-selected columns (a large number of columns) are lowered as compared to selected columns in an actual sense, thus making it possible to contribute to much reduction in the power dissipation as a whole.

Figure 5:
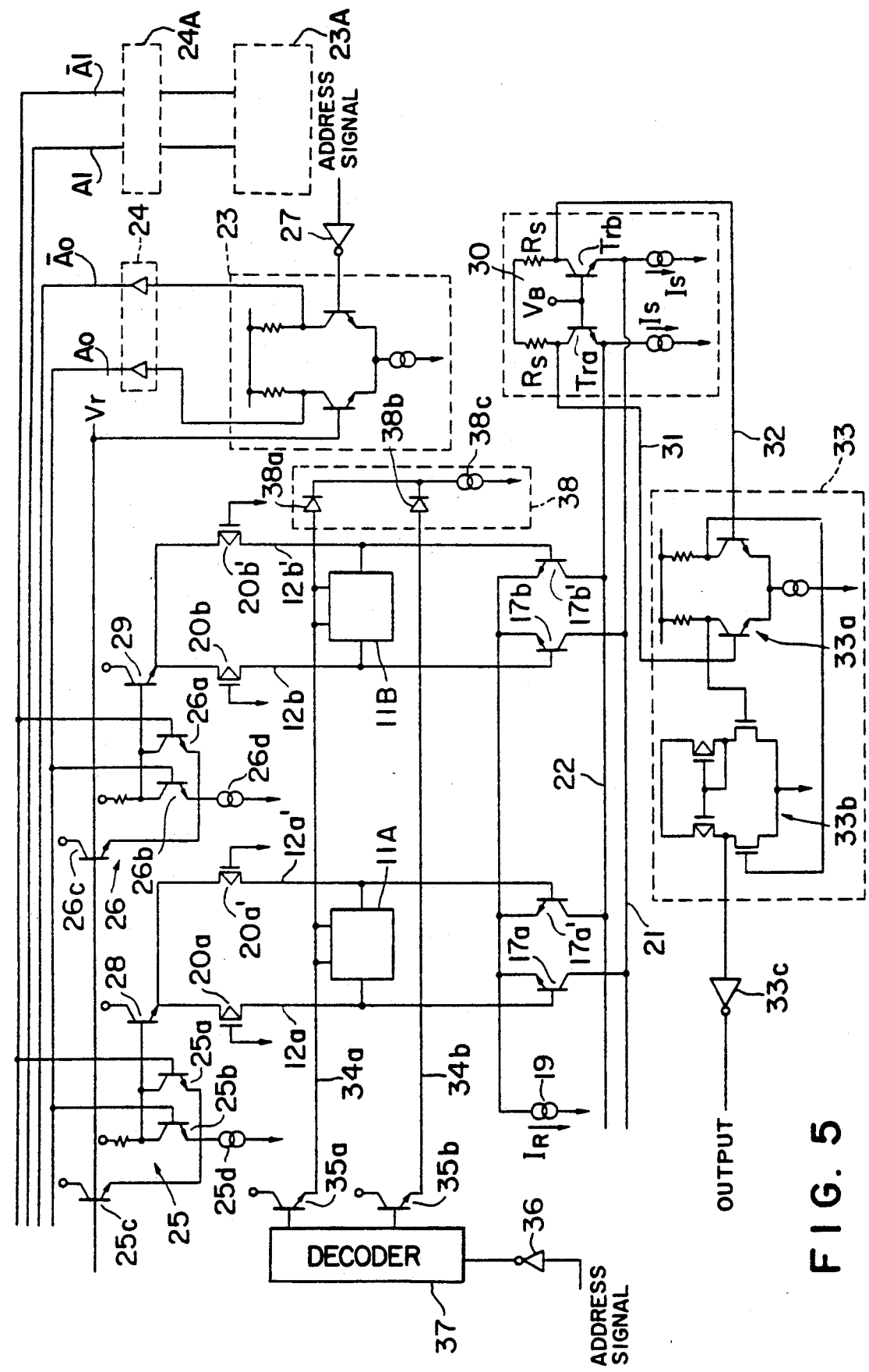
FIG. 5 is a circuit diagram showing another embodiment of a semiconductor device according to this invention.

A semiconductor memory device according to another embodiment of this invention is shown in FIG. 5. The same components as those in the above-mentioned embodiment are designated by the same reference numerals, respectively, and their explanation will be omitted. The semiconductor memory device according to this embodiment is applied to a TTL compatible CMOS memory.

Loads 20a and 20a' of the bit lines 12a and 12a' are commonly connected and are further connected to a decoder 25 through a bipolar transistor 28. The decoder 25 is comprised of ECL. Namely, three bipolar transistors 25a, 25b and 25c of which the emitters are commonly connected and a constant current source 25d connected to the common junction thereof are provided. The bases of the bipolar transistors 25a and 25b are connected to decode lines. A potential Vr which is medium between high and low levels is applied to the bipolar transistor 25c.

Loads 20b and 20b' of the bit lines 12b and 12b' are commonly connected and are further connected to a decoder 26 through a bipolar transistor 29. The decoder 26 has the same configuration as that of the decoder 25. Namely, three bipolar transistors 26a, 26b and 26c of which emitters are commonly connected and a constant current source 26d connected to the common junction thereof are provided. The bases of the bipolar transistors 26a and 26b are connected to the decode lines. A potential Vr which is midway between high and low levels, is applied to the bipolar transistor 26c. The decoder 25 and bipolar transistor 28, and the decoder 26 and bipolar transistor 29, form column select means (such as shown in FIG. 3).

An address signal is input to a converter 23 via an inverter 27. The converter 23 converts the address signal to a signal of small amplitude. The signal thus converted, becomes a decode signal via a buffer 24 comprised of, e.g., an emitter follower. This decode signal allows potentials on the selected bit lines of the columns A and B to be higher than those on the non-selected bit lines by about 0.2 to 0.8 volts.

The sense lines 21 and 22 are connected to a sense amplifier 30. This sense amplifier 30 includes bipolar transistors Tra and Trb emitters of which are connected to the sense lines 21 and 22, respectively. The bases of these bipolar transistors Tra and Trb are commonly connected. A potential VB is applied to the common junction thereof. Constant current sources Is connected to respective emitters of the bipolar transistors Tra and Trb are provided. In addition, resistors Rs are connected to the collectors of the bipolar transistors Tra and Trb, respectively. These collectors serve as output terminals and output lines 31 and 32 are connected to a differential amplifier 33.

When the potential VB is set to a fixed potential, outputs appear on the output lines 31 and 32. Since the connectors are connected, so that the sense lines 21 and 22 having large parasitic resistance are clamped to substantially VB-Vf, the amplitude is suppressed to a small value, to become extremely advantageous for high speed operation.

The differential amplifier 33 comprises two stages of differential amplifiers 33a and 33b. The differential amplifier 33a of the first stage is of the bipolar type which is advantageous to amplifying of an infinitesimally small signal. The differential amplifier 33b of the second stage comprises a CMOS transistors circuit including a function to convert the level of a signal input thereto eventually to the CMOS level. The output of the differential amplifier 33 is inverted by the inverter 33c. The output thus obtained serves as an output of the entire semiconductor memory device of this embodiment.

In this embodiment, bipolar transistors 35a and 35b are used also for selection of word lines 34a and 34b, respectively. Since the word lines 34a and 34b have large parasitic capacitance, bipolar transistors 35a and 35b of the emitter-follower are provided in order to drive these word lines 34a and 34b, respectively. In addition, a discharge circuit 38 is provided in order to rapidly carry out discharge or drop of the level of the word lines 34a and 34b. This discharge circuit 38 comprises diodes 38a and 38b connected to the respective word lines 34a and 34b, and a constant current source 38c commonly connected to these diodes 38a and 38b.

An address signal is input to a decoder 37 via an inverter 36. The decoded signal turns on either of the bipolar transistors 35a and 35b to drive the word line 34a or 34b.

This invention can be modified in various manners without being limited to the above-mentioned embodiments. For example, the semiconductor memory device applied to the TTL compatible CMOS memory has been described in the above-mentioned embodiments, but this invention is applicable to an ECL compatible CMOS memory. In this case, the level converter 23 is unnecessary and the differential amplifier 33b of the second stage of the differential amplifier 33 is also unnecessary. However, a circuit for raising the potential on the word line to a value near the power supply voltage is required instead. Furthermore, a Schottky diode or MOS transistor in which the drain and the gate are connected, may be used in place of the diode in the above-mentioned discharge circuit. In addition, the sense amplifier is not limited to one used in the above-mentioned embodiments, as for instance, sense line may be pulled-up using a resistor.

What is claimed is:

1. A semiconductor memory device comprising:
   a memory cell array comprising MOS type memory cells arranged in a matrix manner;
   a plurality of bit line pairs for connecting respective ones of said MOS type memory cells in a column direction;
   a plurality of bipolar transistors connected to said bit line pairs, respectively, the bases thereof being connected to corresponding ones of said bit lines, the emitters thereof being commonly connected;
   a constant current source being connected to the common connection of said emitters of said plurality of bipolar transistors; and
   column select means for selecting one column of MOS type memory cells by raising or lowering potentials on the bit lines of a selected pair of said plural pairs of bit lines from those on the bit lines of non-selected pairs thereof.

2. A semiconductor device as set forth in claim 1, which further comprises:
   a first sense line for commonly connecting the collectors of said bipolar transistors which are connected to a predetermined bit line in each of said bit line pairs;
   a second sense line for commonly connecting the collectors of said bipolar transistors which are connected to the other bit line in each of said bit line pairs; and
   sense means for sensing a difference between a voltage on said first sense line and that on said second sense line.

3. A semiconductor memory device as set forth in claim 2, wherein said sense means comprises:
   a pair of bipolar transistors, the bases thereof being commonly connected, the emitters thereof being respectively connected to said first and second sense lines;

a pair of constant current sources connected to said emitters of said pair of bipolar transistors; and a pair of loads respectively connected to the collectors of said pair of bipolar transistors in said sense means to sense a difference between a potential on said first sense line and that on said second sense line by a difference between potentials on said collectors of said pair of bipolar transistors.

4. A semiconductor memory device as set forth in claim 1, which further comprises:

a plurality of word lines for connecting said MOS type memory cells in a row direction;

a plurality of second bipolar transistors connected to said word lines, respectively, the emitters thereof being connected to corresponding word lines; and row select means for selecting one row of MOS type memory cells by allowing potentials on bases of said second bipolar transistors connected to selected word lines of said plurality of word lines to be different from those on the bases of said second bipolar transistors connected to non-selected word lines.

5. A semiconductor memory device as set forth in claim 4, which further comprises:

a first sense line for commonly connecting the collectors of said bipolar transistors which are connected to a predetermined bit line in each of said bit line pairs;

a second sense line for commonly connecting the collectors of said bipolar transistors which are connected to the other bit line in each of said bit line pairs; and sense means for sensing a difference between a voltage on said first sense line and that on said second sense line.

6. A semiconductor memory device as set forth in claim 5, wherein said sense means comprises:

a pair of bipolar transistors, the bases thereof being commonly connected, the emitters thereof being respectively connected to said first and second sense lines;

a pair of constant current sources connected to said emitters of said pair of bipolar transistors; and a pair of loads respectively connected to the collectors of said pair of bipolar transistors in said sense means to sense a difference between a potential on said first sense line and that on said second sense line by a difference between potentials on said collectors of said pair of bipolar transistors.

7. A semiconductor memory device as set forth in claim 4, which further comprises discharge means connected to said word lines to discharge potentials on said word lines.

8. A semiconductor memory device as set forth in claim 7, which further comprises:

a first sense line for commonly connecting the collectors of said bipolar transistors which are connected to a predetermined bit line in each of said bit line pairs;

a second sense line for commonly connecting the collectors of said bipolar transistors which are connected to the other bit line in each of said bit line pairs; and sense means for sensing a difference between a voltage on said first sense line and that on said second sense line.

9. A semiconductor memory device as set forth in claim 8, wherein said sense means comprises:

a pair of bipolar transistors, the bases thereof being commonly connected, the emitters thereof being respectively connected to said first and second sense lines;

a pair of constant current sources connected to said emitters of said pair of bipolar transistors; and a pair of loads respectively connected to the collectors of said pair of bipolar transistors in said sense means to sense a difference between a potential on said first sense line and that on said second sense line by a difference between potentials on said collectors of said pair of bipolar transistors.

* * * * *